(12) United States Patent
Burton

(10) Patent No.: US 10,840,230 B2
(45) Date of Patent: Nov. 17, 2020

(54) SEMICONDUCTOR DEVICE HAVING VOLTAGE REGULATORS EMBEDDED IN LAYERED PACKAGE

(71) Applicant: Intel Corporation, Santa Clara, CA (US)

(72) Inventor: Edward A. Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/820,948

(22) Filed: Mar. 17, 2020

(65) Prior Publication Data
US 2020/0219864 A1 Jul. 9, 2020

Related U.S. Application Data

(63) Continuation of application No. 16/146,801, filed on Sep. 28, 2018, now Pat. No. 10,643,984.

(51) Int. Cl.
| | | |
|---|---|---|
| *H01L 25/18* | (2006.01) | |
| *H01L 23/538* | (2006.01) | |
| *H01L 25/00* | (2006.01) | |
| *H01L 23/31* | (2006.01) | |

(52) U.S. Cl.
CPC .......... *H01L 25/18* (2013.01); *H01L 23/3121* (2013.01); *H01L 23/5383* (2013.01); *H01L 23/5389* (2013.01); *H01L 25/50* (2013.01)

(58) Field of Classification Search
CPC ............. H01L 23/3121; H01L 23/5383; H01L 23/5389; H01L 25/18; H01L 25/50
See application file for complete search history.

(56) References Cited

U.S. PATENT DOCUMENTS

| | | | |
|---|---|---|---|
| 10,643,984 B2 * | 5/2020 | Burton | ............ H01L 25/18 |
| 2016/0093588 A1 | 3/2016 | Wang et al. | |
| 2020/0105733 A1 | 4/2020 | Burton | |

OTHER PUBLICATIONS

"U.S. Appl. No. 16/146,801, Notice of Allowance dated Dec. 16, 2019", 6 pgs.
"U.S. Appl. No. 16/146,801, Supplemental Notice of Allowability dated Apr. 7, 2020", 3 pgs.

* cited by examiner

*Primary Examiner* — Andrew Q Tran
(74) *Attorney, Agent, or Firm* — Schwegman Lundberg & Woessner, P.A.

(57) ABSTRACT

A computing chip can include one or more voltage regulators to decrease a standard voltage, such as twelve volts, to a relatively low operating voltage of its processing cores, typically around one volt. Because the power consumed by the cores can be substantial, such as three hundred watts or more, it is desirable to locate the voltage regulators as close as possible to the cores, to reduce the distances that relatively large currents have to travel in the chip circuitry. The voltage regulators can be embedded within the package, such as in a layered structure, in a layer that electrically connects to the cores. While the cores are typically manufactured using the smallest possible lithographic features, the voltage regulators are less demanding and can instead use relatively large lithographic features, which can be formed using relatively old technology, and can therefore be relatively inexpensive.

20 Claims, 4 Drawing Sheets

SEMICONDUCTOR DEVICE HAVING VOLTAGE REGULATORS EMBEDDED IN LAYERED PACKAGE

PRIORITY

This application is a continuation of U.S. patent application Ser. No. 16/146,801, filed Sep. 28, 2018, which is incorporated by reference herein in its entirety.

FIELD OF THE DISCLOSURE

The present disclosure relates generally to voltage regulators for a semiconductor device.

BACKGROUND OF THE DISCLOSURE

A semiconductor device can include one or more voltage regulators to decrease a standard voltage, such as 12 volts, to a relatively low operating voltage of its processing cores, typically around one volt, such as 0.7 volts, 1.2 volts, or 1.4 volts. Because the power consumed by the cores can be substantial, such as about three hundred watts, it is desirable to locate the voltage regulators as close as possible to the cores, to reduce the distances that relatively large currents have to travel in order to supply power to the device circuitry.

Figure 1:
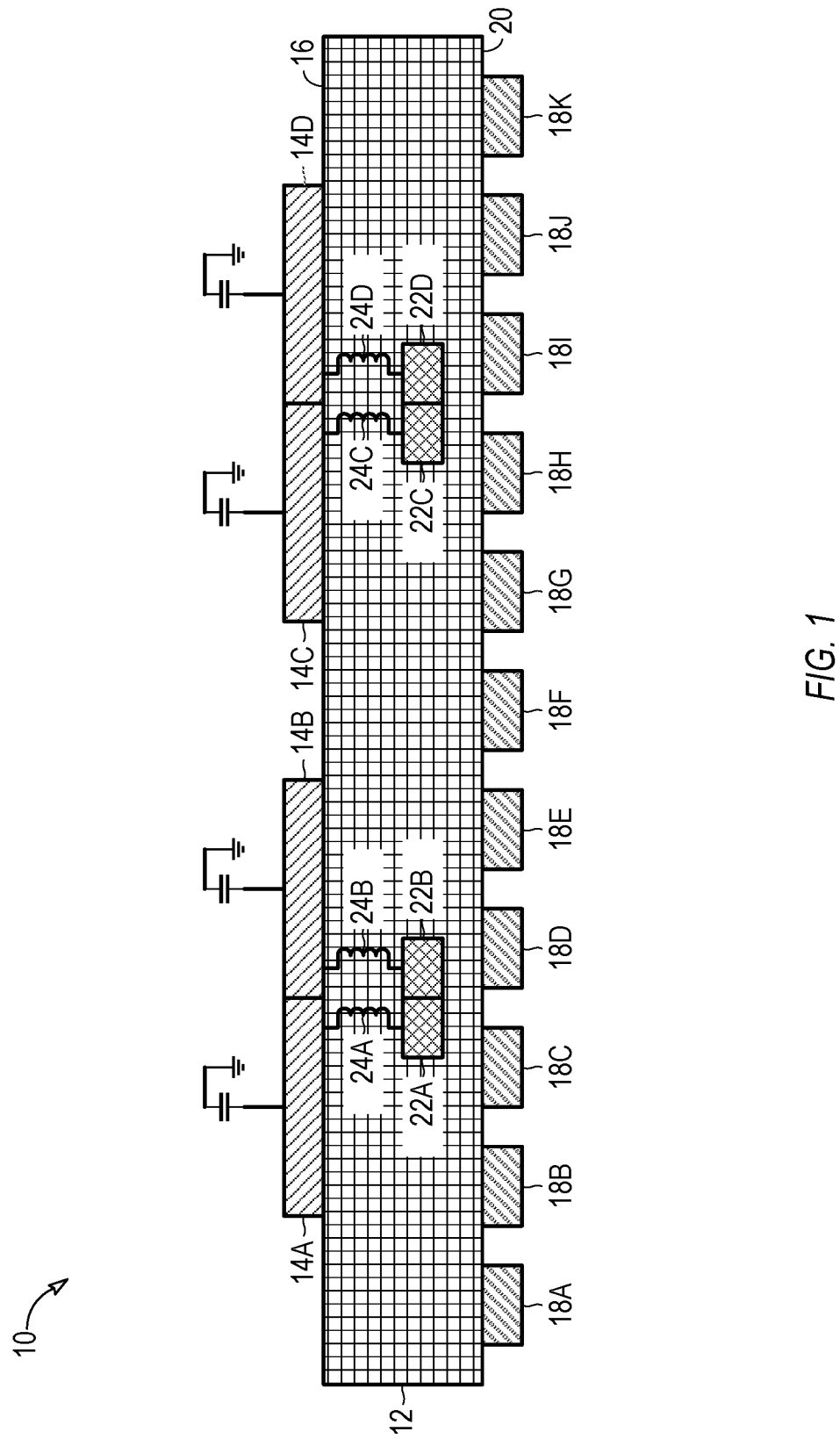
FIG. 1 shows a cross-sectional side view of an example of a semiconductor device having voltage regulators embedded in a layered package, in accordance with some examples.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

To position voltage regulators as close as possible to processing cores in a computing chip, and thereby reduce the distances that relatively large currents have to travel in the chip circuitry, the voltage regulators can be embedded within the package, such as in a layer of a layered structure, that electrically connects to the cores. In the text that follows, the terms computing chip and semiconductor device are used interchangeably, and the terms processing core and semiconductor die are also used interchangeably.

In the figures and the text that follows, the terms "top", "bottom", "horizontal", and "vertical" are used to show orientations of particular features on particular elements, or relative orientations of one element to another element. The designations of horizontal and vertical are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned horizontally on top of a horizontal motherboard, which establishes directions of up and down, and top and bottom, relative to this convention.

There are advantages to positioning the voltage regulators within the package.

As a first advantage, compared with a configuration in which the voltage regulators are surface-mounted beside the semiconductor device, positioning the voltage regulators within the package greatly reduces the distances that relatively large currents have to travel in the chip circuitry. The distance between a surface-mounted voltage regulator a core in an interior of the semiconductor device can approach half of a dimension of the semiconductor device. For example, for a die size comparable to 20 mm, propagating current of about 100 amperes over a 10 mm length can be impractical.

As a second advantage, while the cores are typically manufactured using the smallest possible lithographic features, the voltage regulators are less demanding and can instead use relatively large lithographic features.

In general, for cores in a semiconductor device, there is great benefit to making the transistors as small as possible. For example, doing so can increase the number of transistors per area in the cores, which can increase computing power and can reduce the cost per transistor. The increase in transistor density over time has become known as Moore's Law.

Surprisingly, it is found that voltage conversion circuitry does not benefit from making the transistors as small as possible. For voltage conversion, it is found that the factor that limits the power can be the actual connections, or bumps, between the silicon die and the package, rather than the power transistors. In other words, improving the voltage conversion transistors by making them smaller may not allow an increase in the power capacity. As a result, it can be beneficial to keep the voltage conversion circuit elements relatively large, compared to elements used in the cores.

Keeping the voltage conversion transistors relatively large, compared to the core transistors, can have an unexpected benefit. For example, while the core transistors are typically manufactured using the most cutting-edge lithographic techniques, the relatively large voltage conversion transistors can be manufactured using relatively old lithographic technology that can date back one or more product generations. This relatively old technology can be significantly less expensive than the cutting-edge technology, because it can utilize equipment that has depreciated significantly over time. As a result, compared to a case in which the most cutting-edge technology is used to produce the voltage conversion transistors, such as if the voltage conversion were embedded in the core circuitry, using the relatively old lithographic technology can result in a substantial cost savings.

As a third advantage, positioning the voltage regulators within the package can avoid redesigning and debugging the voltage regulator circuitry for every process node.

As a fourth advantage, positioning the voltage regulators within the package can avoid physically or electrically interfering with electrical contact arrays of lands, bumps, or pins, which may be on the bottom surface of the package.

As a fifth advantage, positioning the voltage regulators within the package can avoid a voltage regulator yield loss associated with larger server chips, because the yield of the voltage regulators (made using relatively old and reliable technology) is relatively high.

As a sixth advantage, because the voltage regulators are embedded within the package prior to adding the relatively expensive compute silicon to the package, the package and its embedded voltage regulators can be tested prior to adding the relatively expensive compute silicon. Thus, any malfunctioning voltage regulators may not cause the loss of fully functioning and potentially expensive compute silicon.

As a seventh advantage, positioning the voltage regulators within the package can allow direct access to every core in a server's two-dimensional array of cores.

As an eighth advantage, a voltage regulator embedded in the package may be formed with gallium nitride, silicon carbide, or some other transistor technology, which can have some beneficial characteristics, such as being capable of handling higher voltages than silicon, being capable of handling higher temperatures than silicon, and others.

Other advantages are also possible.

A package can be formed on a fiber-reinforced substrate (also known as a glass-reinforced substrate). The substrate can be generally planar, and can be generally rigid enough to mechanically support additional layers and components that can be subsequently attached to the substrate. The substrate can be clad in copper. The copper cladding can be patterned to form a two-layer circuit board. Additional layers can be built up, outside of the cladding and substrate. The additional build-up layers can be formed on a front side of the substrate and on a back side of the substrate.

The additional build-up layers typically use blind, buried vias, so that each layer can have its own vias that connect to a previous layer. In contrast with an earlier generation of packaging, where a via was typically formed by mechanically drilling through multiple layers, modern packaging can typically avoid having two layers share a common via.

Embedded bridge technology can allow a pre-formed piece of silicon, with its features and circuitry elements, to be embedded in a layered circuitry structure. To form an embedded bridge, a hole can be cut through one or more build-up layers. A piece of silicon can be placed on the last layer under the hole and fixed in place (through gluing, braising, or the like). A subsequent layer can be laser ablated to form vias to the silicon. In this manner, the silicon bridge can be processed like any layer, but can include features that can be much finer than what can be achieved in the typical layer processing.

While embedded bridge technology typically allows finer features to be incorporated into the layered structure, it is found that this technology can also be used to embed the DC-to-DC voltage conversion circuitry, with its relatively coarse features, into the layered structure.

The embedded bridge technology, when used for voltage regulation, can allow for so-called "air core" inductors to be used in the circuitry. In reality, the inductors can be formed using epoxy as a material, which has the same magnetic properties as air. Although epoxy can have more capacitance than air, the capacitance for voltage regulation circuitry can be negligible at the frequencies involved with voltage regulation, rendering the difference insignificant.

In voltage regulation circuitry, the embedded silicon can be embedded in a particular layer in a stack of layers. In some examples, the embedded silicon can be embedded on a front side of the substrate, on the same side of the package as the processing cores. In other examples, the embedded bridge can be embedded on a back side of the substrate, where the electrical connections tend to be positioned. In some examples, embedding the voltage regulation circuitry on the back side of the package (e.g., away from the point-of-load silicon) can be beneficial, because the package thickness itself can form an inductance that is suitable for connecting the voltage regulation circuitry to the load, optionally without the need for including an explicit inductor component.

It is instructive to discuss the components that are used in typical voltage regulation circuitry. To reduce a voltage, a voltage regulation circuit can pass the voltage through four transistors, arranged in series. The first two transistors can be PMOS, and the second two transistors can be NMOS. The first transistor can accept an input voltage. The last transistor can be connected to ground. The middle two transistors (one PMOS, one NMOS) can have gates that are attached to a DC voltage. The outer two transistors (also one PMOS, one NMOS) can be switched at a particular frequency and duty cycle. The midpoint between the middle two transistors can be connected to a first end of an inductor. The second end of the inductor can be connected to a capacitor to ground and to a load. For typical voltage regulation circuits that are included with a motherboard, a typical switching frequency can be on the order of 1 MHz, or below. For typical voltage regulation circuits that are included with the packaging, as discussed herein, a typical switching frequency can be on the order of 100 MHz to 120 MHz, although other frequencies can also be used.

Because the switching frequency can be substantially higher than what is commonly used on a motherboard, the value of inductance can be substantially less than what is commonly used on a motherboard. For example, the inductor for the package-based voltage regulation circuits can have a value of 1 nH, compared to a value of 200 nH for a typical motherboard-based voltage regulation circuits. Advantageously, such a low value of inductance can be achieved by residual geometry in the circuit, without using an explicit inductor component. For example, a hole drilled through a board, with nothing else in the vicinity, can have an inductance value on the order of 1 nH. Because the package-based voltage regulation circuits can rely on ambient structures in the package to achieve the low inductance value, the package-based voltage regulation circuits can eliminate the use of an explicit inductor component, which is beneficial.

FIG. 1 shows a cross-sectional side view of an example of a semiconductor device 10 having voltage regulators embedded in a layered package, in accordance with some examples. The configuration of FIG. 1 is but one example of such a semiconductor device; other suitable configurations can also be used.

A package 12 can include circuitry arranged in layers that are electrically connected to one another through electrically conductive vias.

A semiconductor die 14A can be positioned on a front side 16 of the package 12 and electrically connected to the package 12. In some examples, the semiconductor die 14A can be one of a plurality of semiconductor dies 14A-D positioned on the front side 16 of the package 12 and electrically connected to the package 12. In some examples, the semiconductor dies 14A-D can each include a capacitor connected to ground. Other electrical configurations can also be used.

An electrical connection 18A can be positioned on a back side 20 of the package 12 and electrically connected to the package 12. In some examples, the electrical connection 18A can be one of a plurality of electrical connections 18A-K positioned on the back side 20 of the package 12 and electrically connected to the package 12. In some examples, the electrical connections 18A-K can be smaller than the semiconductor dies 14A-D and positioned more closely together than the semiconductor dies 14A-D, so that the electrical connections 18A-K and semiconductor dies 14A-D need not be in a one-to-one correspondence. The electrical connections 18A-K can include one or more of input/output lands, pins, balls edge connectors, or other suitable electrically conductive elements. The electrical connections 18A-K can be configured to electrically connect to corresponding connectors on an additional mating element when the package 12 is brought into contact with the mating element. In addition to the electrical connections 18A-K, the back side 20 of the package 12 can additionally include one or more capacitors, inductors, resistors, or other suitable electrical components.

A voltage regulator 22A can be embedded within the package 12. The voltage regulator 22A can accept a first voltage from an electrical connection 18C, reduce the first voltage to a second voltage, and deliver the second voltage to a respective semiconductor die 14A. In some examples, the voltage regulator 22A can accept the first voltage from multiple electrical connections 18A-K in parallel. Accepting the voltage in parallel can spread the current over multiple electrical connections 18A-K, which can improve reliability and reduce the risk of damaging a particular connection. Because providing a voltage generally requires two electrical connections (such as a voltage rail and a ground rail), it will be understood that the package can also provide a ground rail (not shown), which can electrically connect to the package 12, to the electrical connections 18A-K, to an external device connected to the electrical connections 18A-K, and to the semiconductor dies 14A-D, as needed.

In particular, the voltage regulator 22A can be embedded within the package 12, rather than grown as a layer within the package 12, or formed integrally with the package 12. Specifically, the voltage regulator 22A can be formed external to the package 12, then attached to the package 12 by the embedding procedure. Forming the voltage regulator 22A external to the package allows additional flexibility in the procedures used to fabricate the voltage regulator 22A. In some examples, the voltage regulator 22A can include voltage regulation circuitry positioned on a base. In some examples, the base can be formed from a suitable semiconductor material, such as silicon, gallium nitride, silicon carbide, or others. In some examples, the voltage regulator 22A can be embedded by placing the voltage regulation circuitry and the base onto a first layer of the package 12, then forming a second layer of the package 12 on the voltage regulation circuitry.

In some examples, the voltage regulator 22A can be formed using relatively coarse features, compared with the semiconductor dies 14A-D. Such coarse features can be produced relatively inexpensively, compared to the relatively small features of the semiconductor dies 14A-D. In some examples, the voltage regulation circuitry can include features having a first minimum feature size. In some examples, the semiconductor die can include features having a second minimum feature size smaller than the first minimum feature size. In some examples, the feature size can represent a size of a transistor on the voltage regulator 22A or the semiconductor dies 14A-D. In some examples, the voltage regulator 22A can be formed from a suitable semiconductor material, such as a silicon, gallium nitride, silicon carbide, or others.

In some examples, the package 12 can be formed as layers disposed on a substrate. In some examples, the voltage regulator 22A can be positioned between the substrate and the electrical connection 18A. In other examples, the voltage regulator 22A can be positioned between the substrate and the semiconductor dies 14A-D.

In some examples, the first and second voltages can be direct current (e.g. time-invariant or slowly-varying). It is intended that the term direct current can include a relatively small oscillatory voltage or current, on top of a relatively large slowly-varying or time-invariant voltage or current. It will be understood that the magnitude or amplitude of the small oscillatory voltage or current can be insignificantly small, and/or the frequency of the small oscillatory voltage can be high enough such that downstream components effectively average out the oscillatory voltage over time.

In some examples, the voltage regulator 22A can include four transistors that are arranged in series. A first of the four transistors can be a PMOS transistor switched at a frequency and a duty cycle. A second of the four transistors can be a PMOS transistor having a gate attached to a direct current voltage. A third of the four transistors can be an NMOS transistor having a gate attached to the direct current voltage. A fourth of the four transistors can be an NMOS transistor switched at the frequency and the duty cycle. This is but one example of components in a voltage regulator 22A; other suitable components can also be used.

In some examples, the voltage regulator 22A can be one of a plurality of voltage regulators 22A-D embedded within the package 12. In some examples, the voltage regulators 22A-D and the semiconductor dies 14A-D can be arranged in a one-to-one correspondence. In some examples, the plurality of voltage regulators 22A-D can be embedded within a single layer of the package 12.

In some examples, each voltage regulator 22A-D can be electrically connected to a respective semiconductor die 14A-D by an electrical path having an inductance 24A-D. In some examples, the inductance 24A-D can be provided by a structure of the package 12, such that the electrical path lacks an explicit inductor component. For example, a hole through one or more layers of the package may produce enough electrical inductance, by itself, to operate with the voltage regulator circuitry. In other examples, explicit inductor components can be used.

Figure 2:
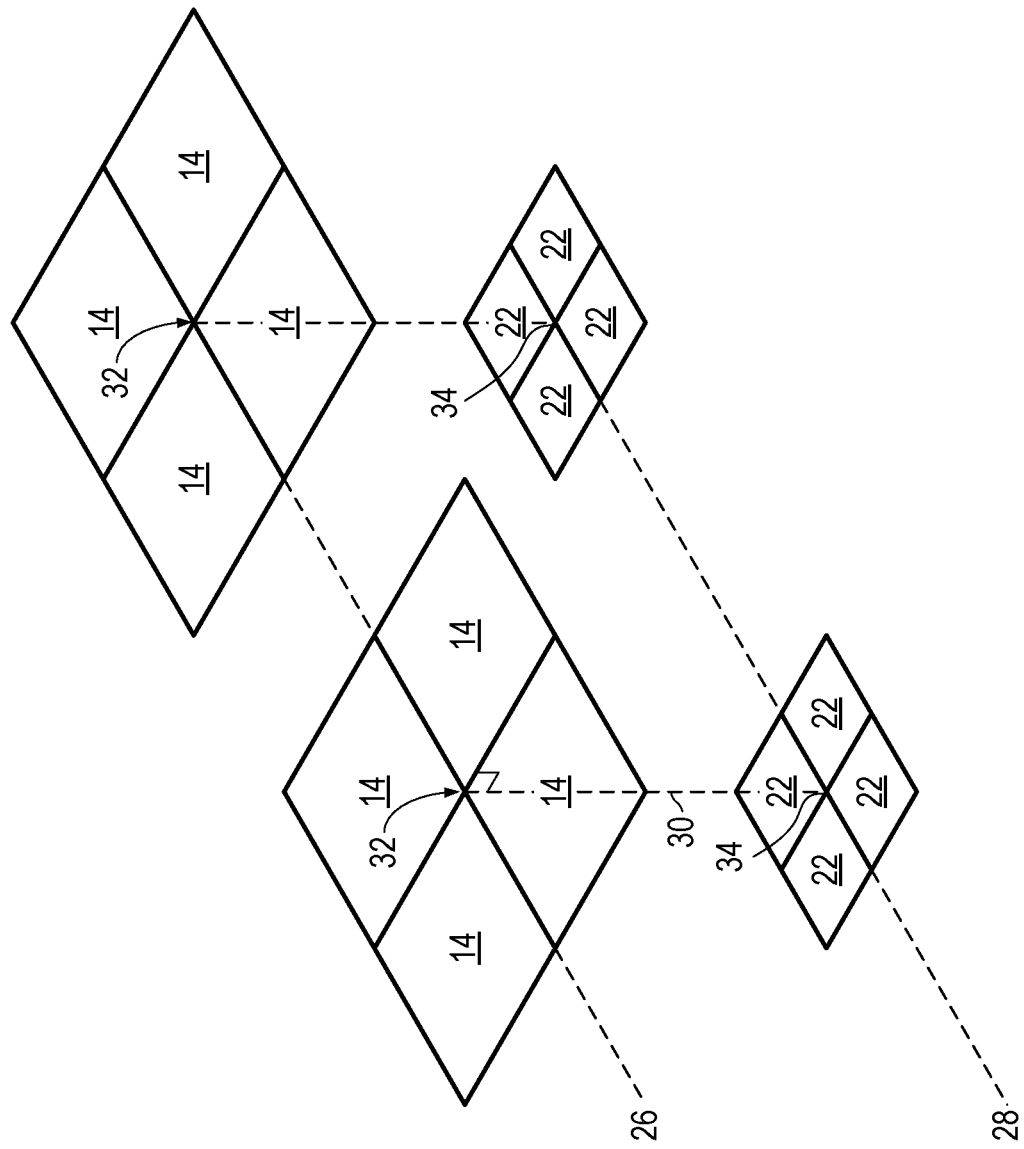
FIG. 2 shows a perspective view of an example of relative orientations of the semiconductor dies and the voltage regulators of FIG. 1, in accordance with some examples.

FIG. 2 shows a perspective view of an example of relative orientations of the semiconductor dies 14 and the voltage regulators 22 of FIG. 1, in accordance with some examples. The example of FIG. 2 is but one example; other configurations can also be used.

In some examples, the plurality of semiconductor dies 14 can be arranged as a first two-dimensional array 26, the plurality of voltage regulators 22 can be arranged as a second two-dimensional array 28, and the second two-dimensional array can be offset from the first two-dimensional array in a direction 30 orthogonal to the first two-dimensional array. In some examples, the plurality of semiconductor dies 14 can be arranged in clusters of four semiconductor dies 14 that share a common corner 32. In some examples, the plurality of voltage regulators 22 can be arranged in clusters of four voltage regulators 22 that share a common corner 34. In some examples, the common corners 34 of the voltage regulators 22 can be offset from the common corners 32 of the semiconductor dies 14 in the direction 30 orthogonal to the first two-dimensional array 26. This is but one possible geometry for the semiconductor dies 14 and the voltage regulators 22; other suitable geometries can also be used.

Figure 3:
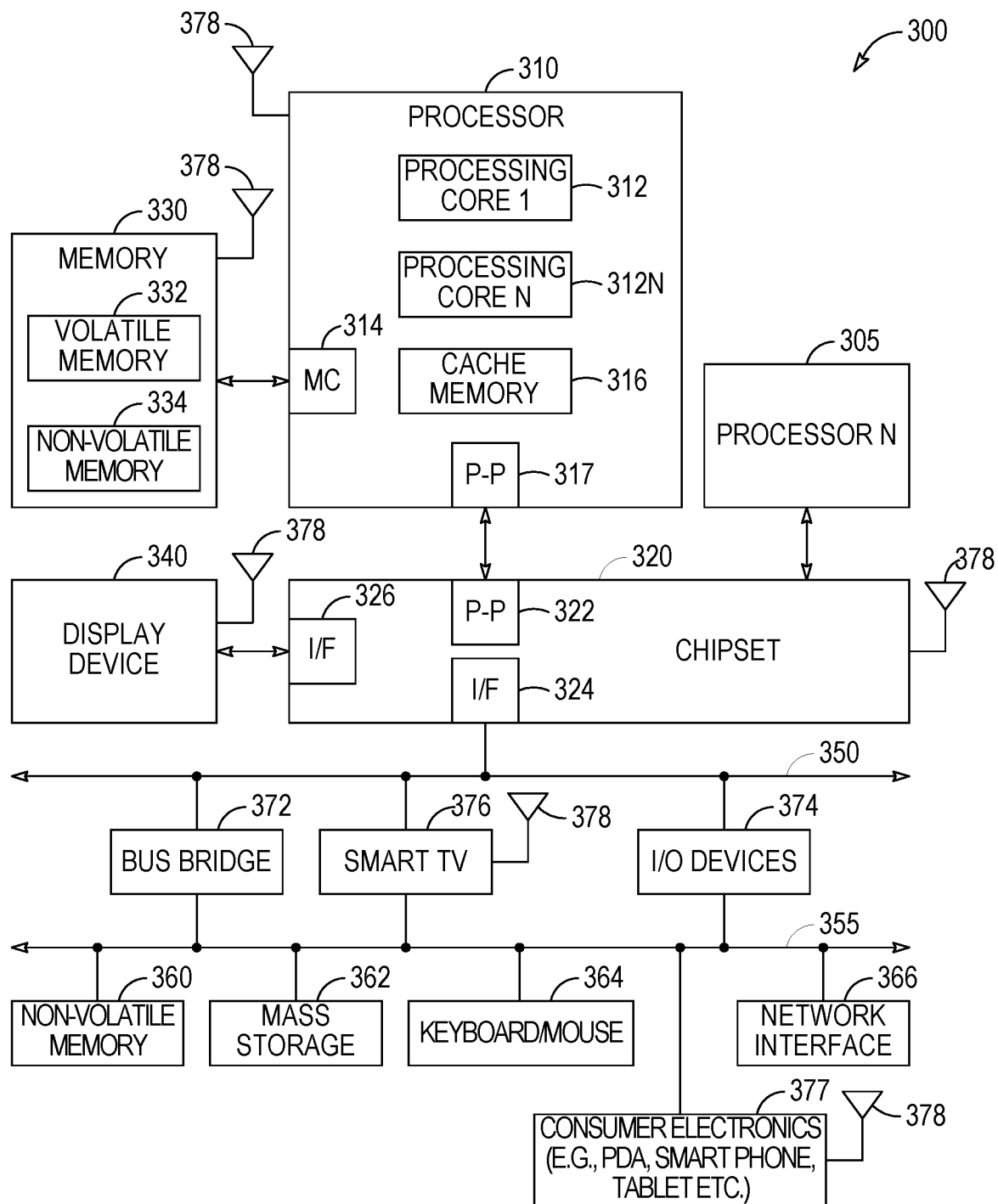
FIG. 3 illustrates a system level diagram, depicting an example of an electronic device (e.g., system) including the device and system as described in the present disclosure.

FIG. 3 illustrates a system level diagram, depicting an example of an electronic device (e.g., system) including the device and system as described in the present disclosure.

FIG. 3 is included to show an example of a higher-level device application for the device and system. In one embodiment, system 300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 300 is a system on a chip (SOC) system.

In one embodiment, processor 310 has one or more processing cores 312 and 312N, where 312N represents the Nth processing core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, an interface for wireless antenna 378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 332 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the example system, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices, including a bus bridge 372, a smart TV 376, I/O devices 374, nonvolatile memory 360, a storage medium (such as one or more mass storage devices) 362, a keyboard/mouse 364, a network interface 366, and various forms of consumer electronics 377 (such as a PDA, smart phone, tablet etc.), etc. In one embodiment, chipset 320 couples with these devices through an interface 324. Chipset 320 may also be coupled to a wireless antenna 378 to communicate with any device configured to transmit and/or receive wireless signals.

Chipset 320 connects to display device 340 via interface 326. Display 340 may be, for example, a liquid crystal display (LCD), a light emitting diode (LED) array, an organic light emitting diode (OLED) array, or any other form of visual display device. In some embodiments of the example system, processor 310 and chipset 320 are merged into a single SOC. In addition, chipset 320 connects to one or more buses 350 and 355 that interconnect various system elements, such as I/O devices 374, nonvolatile memory 360, storage medium 362, a keyboard/mouse 364, and network interface 366. Buses 350 and 355 may be interconnected together via a bus bridge 372.

In one embodiment, mass storage device 362 includes, but is not limited to, a solid-state drive, a hard disk drive, a universal serial bus flash memory drive, or any other form of computer data storage medium. In one embodiment, network interface 366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processing core 312.

In some examples, the device of FIG. 3 can include a silicon photonic device, which can benefit from good heat dissipation. In some examples, the silicon photonic device can include a transmitter, which can include a laser diode that can convert an electrical data signal to an optical data signal, and can generate a substantial amount of heat. In some examples, the silicon photonic device can include a receiver, which can include a detector that can convert an optical data signal to an electrical data signal, and can also generate a substantial amount of heat. Both a transmitter and a receiver can benefit from efficient heat dissipation, as explained above.

Figure 4:
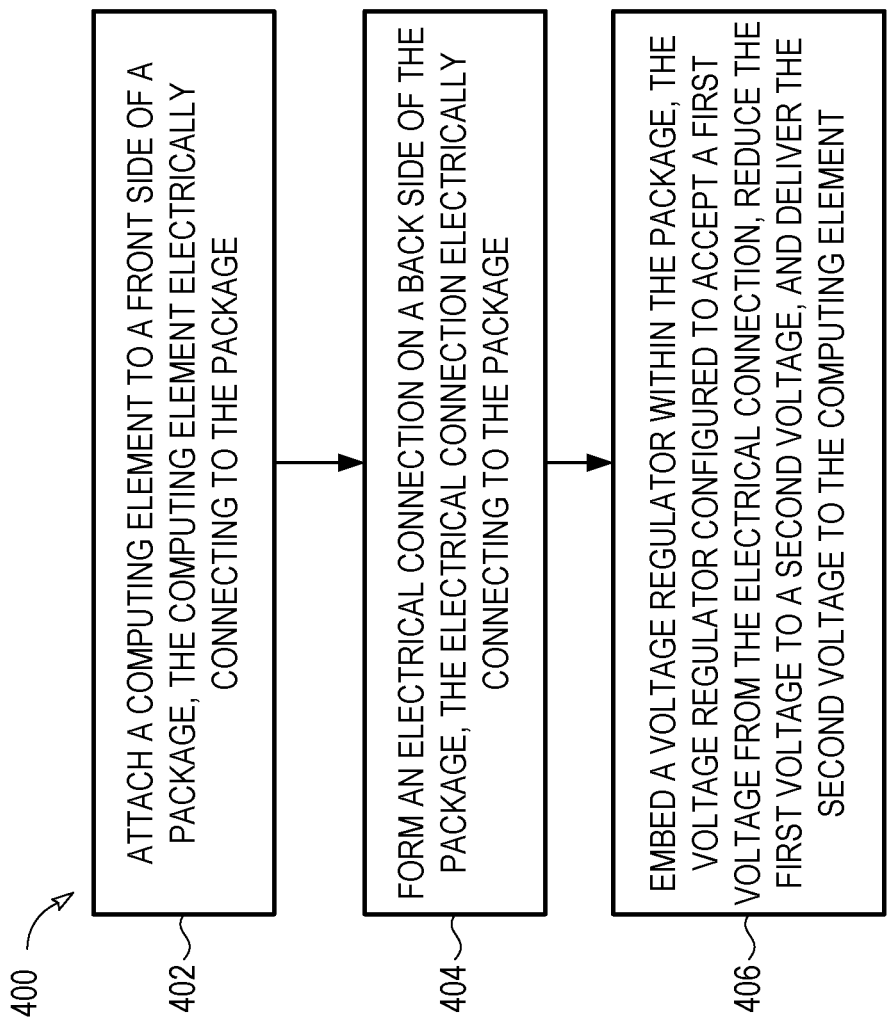
FIG. 4 shows a flowchart of an example of a method for regulating voltage in a semiconductor device, in accordance with some examples.

FIG. 4 shows a flowchart of an example of a method 400 for manufacturing a semiconductor device, in accordance with some examples. The method 400 can be executed to manufacture the semiconductor device 10 of FIG. 1, as well as other devices. The method 400 is but one suitable method for manufacturing a semiconductor device; other suitable methods can also be used.

At operation 402, a computing element can be attached to a front side of a package, the computing element electrically connecting to the package.

At operation 404, an electrical connection can be formed on a back side of the package, the electrical connection electrically connecting to the package.

At operation 406, a voltage regulator can be embedded within the package, the voltage regulator configured to accept a first voltage from the electrical connection, reduce the first voltage to a second voltage, and deliver the second voltage to the computing element.

In some examples, the voltage regulator can include voltage regulation circuitry positioned on a base. In some examples, the voltage regulator can be embedded by placing the voltage regulation circuitry and the base onto a first layer of the package, then forming a second layer of the package on the voltage regulation circuitry. In some examples, the voltage regulation circuitry can include features having a first minimum feature size. In some of these examples, the semiconductor die can include features having a second minimum feature size smaller than the first minimum feature size.

In some examples, the voltage regulator can be electrically connected to the semiconductor die by an electrical path having an inductance. In some examples, the inductance can be provided by a structure of the package. In some of these examples, the electrical path can lack an explicit inductor component.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, a semiconductor device can include: a package including circuitry arranged in layers that are electrically connected to one another through electrically conductive vias; a semiconductor die positioned on a front side of the package and electrically connected to the package; an electrical connection positioned on the package and electrically connected to the package; and a voltage regulator embedded within the package, the voltage regulator configured to accept a first voltage from the electrical connection, reduce the first voltage to a second voltage, and deliver the second voltage to the semiconductor die.

In Example 2, the semiconductor device of Example 1 can optionally be configured such that the electrical connection is positioned on a back side of the package.

In Example 3, the semiconductor device of any one of Examples 1-2 can optionally be configured such that the voltage regulator comprises voltage regulation circuitry positioned on a base.

In Example 4, the semiconductor device of any one of Examples 1-3 can optionally be configured such that the voltage regulation circuitry and the base are embedded between a first layer of the package and a second layer of the package.

In Example 5, the semiconductor device of any one of Examples 1-4 can optionally be configured such that the voltage regulation circuitry includes features having a first minimum feature size; and the semiconductor die includes features having a second minimum feature size smaller than the first minimum feature size.

In Example 6, the semiconductor device of any one of Examples 1-5 can optionally be configured such that the voltage regulator is electrically connected to the semiconductor die by an electrical path having an inductance; the inductance is provided by a structure of the package; and the electrical path lacks an explicit inductor component.

In Example 7, the semiconductor device of any one of Examples 1-6 can optionally be configured such that the package is formed as layers disposed on a substrate; and the voltage regulator is positioned between the substrate and the electrical connection.

In Example 8, the semiconductor device of any one of Examples 1-7 can optionally be configured such that the first and second voltages are direct current.

In Example 9, the semiconductor device of any one of Examples 1-8 can optionally be configured such that the voltage regulator includes four transistors that are arranged in series; a first of the four transistors is a PMOS transistor switched at a frequency and a duty cycle; a second of the four transistors is a PMOS transistor having a gate attached to a direct current voltage; a third of the four transistors is an NMOS transistor having a gate attached to the direct current voltage; and a fourth of the four transistors is an NMOS transistor switched at the frequency and the duty cycle.

In Example 10, the semiconductor device of any one of Examples 1-9 can optionally be configured such that the semiconductor die is one of a plurality of semiconductor dies positioned on the front side of the package and electrically connected to the package; the electrical connection is one of a plurality of electrical connections positioned on the back side of the package and electrically connected to the package; the voltage regulator is one of a plurality of voltage regulators embedded within the package; each voltage regulator of the plurality of voltage regulators is configured to accept a first voltage from at least one electrical connection, reduce the first voltage to a second voltage, and deliver the second voltage to a corresponding semiconductor die of the plurality of semiconductor dies.

In Example 11, the semiconductor device of any one of Examples 1-10 can optionally be configured such that the plurality of voltage regulators are embedded within a single layer of the package.

In Example 12, the semiconductor device of any one of Examples 1-11 can optionally be configured such that the plurality of semiconductor dies are arranged as a first two-dimensional array; the plurality of voltage regulators are arranged as a second two-dimensional array; and the second two-dimensional array is offset from the first two-dimensional array in a direction orthogonal to the first two-dimensional array.

In Example 13, the semiconductor device of any one of Examples 1-12 can optionally be configured such that the plurality of semiconductor dies are arranged in clusters of four semiconductor dies that share a common corner; the plurality of voltage regulators are arranged in clusters of four voltage regulators that share a common corner; and the common corners of the voltage regulators are offset from the common corners of the semiconductor dies in the direction orthogonal to the first two-dimensional array.

In Example 14, a method for manufacturing a semiconductor device can include: attaching a computing element to a front side of a package, the computing element electrically connecting to the package; forming an electrical connection on a back side of the package, the electrical connection electrically connecting to the package; and embedding a voltage regulator within the package, the voltage regulator configured to accept a first voltage from the electrical connection, reduce the first voltage to a second voltage, and deliver the second voltage to the computing element.

In Example 15, the method of Example 14 can optionally be configured such that the voltage regulator comprises voltage regulation circuitry positioned on a base; and embedding the voltage regulator comprises placing the voltage regulation circuitry and the base onto a first layer of the package, then forming a second layer of the package on the voltage regulation circuitry.

In Example 16, the method of any one of Examples 14-15 can optionally be configured such that the voltage regulation circuitry includes features having a first minimum feature size; and the semiconductor die includes features having a second minimum feature size smaller than the first minimum feature size.

In Example 17, a semiconductor device can include: a package including circuitry arranged in layers that are electrically connected to one another through electrically conductive vias; a plurality of semiconductor dies positioned on a front side of the package and electrically connected to the package; a plurality of electrical connections positioned on a back side of the package and electrically connected to the package; and a plurality of voltage regulators embedded within the package, each voltage regulator of the plurality of voltage regulators configured to accept a first voltage from an electrical connection, reduce the first voltage to a second voltage, and deliver the second voltage to a respective semiconductor die of the plurality of semiconductor dies.

In Example 18, the semiconductor device of Example 17 can optionally be configured such that the plurality of voltage regulators are embedded within a single layer of the package; the plurality of semiconductor dies are arranged as a first two-dimensional array; the plurality of voltage regulators are arranged as a second two-dimensional array; and the second two-dimensional array is offset from the first two-dimensional array in a direction orthogonal to the first two-dimensional array.

In Example 19, the semiconductor device of any one Examples 17-18 can optionally be configured such that the plurality of semiconductor dies are arranged in clusters of four semiconductor dies that share a common corner; the plurality of voltage regulators are arranged in clusters of four voltage regulators that share a common corner; and the common corners of the voltage regulators are offset from the common corners of the semiconductor dies in the direction orthogonal to the first two-dimensional array.

In Example 20, the semiconductor device of any one Examples 17-19 can optionally be configured such that each voltage regulator comprises voltage regulation circuitry positioned on a respective base; each voltage regulator is embedded by placing the voltage regulation circuitry and the base onto a first layer of the package, then forming a second layer of the package on the voltage regulation circuitry; the voltage regulation circuitries include features having a first minimum feature size; and the semiconductor dies include features having a second minimum feature size smaller than the first minimum feature size.

What is claimed is:

1. A semiconductor device, comprising:
a package;
a semiconductor die positioned on a front side of the package and electrically connected to the package;
an electrical connection positioned on the package and electrically connected to the package; and
a voltage regulator embedded within the package, the voltage regulator configured to accept a first voltage from the electrical connection, reduce the first voltage to a second voltage, and deliver the second voltage to the semiconductor die.

2. The semiconductor device of claim 1, wherein the electrical connection is positioned on a back side of the package.

3. The semiconductor device of claim 1, wherein the voltage regulator comprises voltage regulation circuitry positioned on a base.

4. The semiconductor device of claim 3, wherein the voltage regulation circuitry and the base are embedded between a first layer of the package and a second layer of the package.

5. The semiconductor device of claim 4, wherein:
the voltage regulation circuitry includes features having a first minimum feature size; and
the semiconductor die includes features having a second minimum feature size smaller than the first minimum feature size.

6. The semiconductor device of claim 1, wherein:
the voltage regulator is electrically connected to the semiconductor die by an electrical path having an inductance;
the inductance is provided by a structure of the package; and
the electrical path lacks an explicit inductor component.

7. The semiconductor device of claim 1, wherein:
the package is formed as layers disposed on a substrate; and
the voltage regulator is positioned between the substrate and the electrical connection.

8. The semiconductor device of claim 1, wherein the first and second voltages are direct current.

9. The semiconductor device of claim 1, wherein:
the voltage regulator includes four transistors that are arranged in series;
a first of the four transistors is a PMOS transistor switched at a frequency and a duty cycle;
a second of the four transistors is a PMOS transistor having a gate attached to a direct current voltage;
a third of the four transistors is an NMOS transistor having a gate attached to the direct current voltage; and
a fourth of the four transistors is an NMOS transistor switched at the frequency and the duty cycle.

10. The semiconductor device of claim 1, wherein:
the semiconductor die is one of a plurality of semiconductor dies positioned on the front side of the package and electrically connected to the package;
the electrical connection is one of a plurality of electrical connections positioned on the back side of the package and electrically connected to the package;
the voltage regulator is one of a plurality of voltage regulators embedded within the package; and
each voltage regulator of the plurality of voltage regulators is configured to accept a first voltage from at least one electrical connection, reduce the first voltage to a second voltage, and deliver the second voltage to a corresponding semiconductor die of the plurality of semiconductor dies.

11. The semiconductor device of claim 10, wherein the plurality of voltage regulators are embedded within a single layer of the package.

12. The semiconductor device of claim 10, wherein:
the plurality of semiconductor dies are arranged as a first two-dimensional array;
the plurality of voltage regulators are arranged as a second two-dimensional array; and
the second two-dimensional array is offset from the first two-dimensional array in a direction orthogonal to the first two-dimensional array.

13. The semiconductor device of claim 12, wherein:
the plurality of semiconductor dies are arranged in clusters of four semiconductor dies that share a common corner;
the plurality of voltage regulators are arranged in clusters of four voltage regulators that share a common corner; and
the common corners of the voltage regulators are offset from the common corners of the semiconductor dies in the direction orthogonal to the first two-dimensional array.

14. A method for manufacturing a semiconductor device, comprising:
attaching a computing element to a package, the computing element electrically connecting to the package;
forming an electrical connection on the package, the electrical connection electrically connecting to the package; and
embedding a voltage regulator within the package, the voltage regulator configured to accept a first voltage from the electrical connection, reduce the first voltage to a second voltage, and deliver the second voltage to the computing element.

15. The method of claim 14, wherein:
the voltage regulator comprises voltage regulation circuitry positioned on a base; and
embedding the voltage regulator comprises placing the voltage regulation circuitry and the base onto a first layer of the package, then forming a second layer of the package on the voltage regulation circuitry.

16. The method of claim 15, wherein:
the voltage regulation circuitry includes features having a first minimum feature size; and
the semiconductor die includes features having a second minimum feature size smaller than the first minimum feature size.

17. A semiconductor device, comprising:
a package;
a plurality of semiconductor dies positioned on a front side of the package and electrically connected to the package;
a plurality of electrical connections positioned on a back side of the package and electrically connected to the package; and
a plurality of voltage regulators embedded within the package, each voltage regulator of the plurality of voltage regulators configured to accept a first voltage from an electrical connection, reduce the first voltage to a second voltage, and deliver the second voltage to a respective semiconductor die of the plurality of semiconductor dies.

18. The semiconductor device of claim 17, wherein:
the plurality of voltage regulators are embedded within a single layer of the package;
the plurality of semiconductor dies are arranged as a first two-dimensional array;
the plurality of voltage regulators are arranged as a second two-dimensional array; and
the second two-dimensional array is offset from the first two-dimensional array in a direction orthogonal to the first two-dimensional array.

19. The semiconductor device of claim 18, wherein:
the plurality of semiconductor dies are arranged in clusters of four semiconductor dies that share a common corner;
the plurality of voltage regulators are arranged in clusters of four voltage regulators that share a common corner; and
the common corners of the voltage regulators are offset from the common corners of the semiconductor dies in the direction orthogonal to the first two-dimensional array.

20. The semiconductor device of claim 17, wherein:
each voltage regulator comprises voltage regulation circuitry positioned on a respective base;
each voltage regulator is embedded by placing the voltage regulation circuitry and the base onto a first layer of the package, then forming a second layer of the package on the voltage regulation circuitry;
the voltage regulation circuitries include features having a first minimum feature size; and
the semiconductor dies include features having a second minimum feature size smaller than the first minimum feature size.

* * * * *